United States Patent
Landry

(10) Patent No.: US 6,411,140 B1
(45) Date of Patent: *Jun. 25, 2002

(54) METHOD AND APPARATUS FOR REDUCING SKEW BETWEEN INPUT SIGNALS AND CLOCK SIGNALS WITHIN AN INTEGRATED CIRCUIT

(75) Inventor: Greg J. Landry, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/307,063

(22) Filed: May 7, 1999

Related U.S. Application Data

(62) Division of application No. 08/960,584, filed on Oct. 29, 1997, now Pat. No. 6,043,684, which is a continuation of application No. 08/576,505, filed on Dec. 21, 1995, now Pat. No. 5,835,970, which is a continuation of application No. 08/575,554, filed on Dec. 20, 1995, now Pat. No. 5,903,174.

(51) Int. Cl.$^7$ ................................................. H03L 7/00
(52) U.S. Cl. ......................... 327/141; 327/162; 326/71; 326/108
(58) Field of Search ................................. 327/141, 154, 327/161, 162; 326/71, 70, 68, 104, 105, 106, 108

(56) References Cited

U.S. PATENT DOCUMENTS

| | | | |
|---|---|---|---|
| 4,429,375 A | 1/1984 | Kobayashi et al. | 365/240 |
| 4,736,123 A | 4/1988 | Miyazawa et al. | 307/443 |
| 4,791,323 A | 12/1988 | Austin | 307/475 |

(List continued on next page.)

FOREIGN PATENT DOCUMENTS

| | | |
|---|---|---|
| JP | 3-132115 | 10/1989 |
| JP | 5-67964 | 9/1991 |

OTHER PUBLICATIONS

Motorola Semiconductor Technical Data Product Review MCM67B618, "64K × 18 Bit BurstRam™ Synchronous Fast Static RAM with Burst Counter and Self–Timed Write", Rev. 3, Jan. 1993, pp. 1–9.

Cypress Semiconductor Corporation, "Preliminary CY7C1031/CY7C1032 64K × 18 Synchronous Cache RAM", Jan. 1993, Revised May 1993, pp. 1–13.

Hitachi Semiconductor, "HM67B1864 Series (Target Spec.), 64 K × 18 Bits Synchronous Fast Static RAM With Burst Counter and Self–Timed Write", Rev. O, Mar. 31, 1994, Product Preview.

(List continued on next page.)

*Primary Examiner*—Tuan T. Lam
(74) *Attorney, Agent, or Firm*—Wagner, Murabito & Hao LLP

(57) ABSTRACT

The integrated circuit includes an input path circuit with an address path having an input buffer for providing address signals to a register. A separate clock path having an input buffer provides a clock signal for clocking the register. The input buffers of both the address path and the clock path include input buffer cells configured to reduce timing delay differences caused by process variations while minimizing current leakage. An exemplary input buffer cell described herein includes a first inverter stage with a pair of NMOS devices connected in series with a PMOS device and a second inverter stage having an additional PMOS device connected along a feedback path around an inverter. The PMOS device along the feedback path operates to assist the pair of NMOS devices to pull a voltage input to the inverter to a high logic state, when an input to the cell is held low, to prevent leakage current through the inverter. The pair of NMOS devices provide a first stage inverter substantially free of process variations. The PMOS device connected in series with the NMOS devices prevents current leakage through the NMOS devices when the input signal is held high.

7 Claims, 14 Drawing Sheets

U.S. PATENT DOCUMENTS

| | | | |
|---|---|---|---|
| 4,857,763 A | 8/1989 | Sakurai et al. | 307/443 |
| 4,877,978 A | 10/1989 | Platt | 307/473 |
| 4,893,281 A | 1/1990 | Hashimoto | 365/230.06 |
| 4,978,905 A | 12/1990 | Hoff et al. | 323/314 |
| 4,979,166 A | 12/1990 | Yamada | 370/84 |
| 5,057,715 A | 10/1991 | Larsen et al. | 307/451 |
| 5,136,182 A | 8/1992 | Fawal | 307/296.8 |
| 5,157,284 A | 10/1992 | O'Connell et al. | 307/463 |
| 4,638,187 A | 3/1993 | Boler et al. | 307/451 |
| 5,305,282 A | 4/1994 | Choi | 365/230.08 |
| 5,386,153 A | 1/1995 | Voss et al. | 326/34 |
| 5,481,581 A | 1/1996 | Jonas, Jr. | 377/55 |
| 5,493,530 A | 2/1996 | Lee et al. | 365/189.05 |
| 5,526,320 A | 6/1996 | Zagar et al. | 365/233.5 |
| 5,552,723 A | 9/1996 | Shigehara et al. | 326/86 |
| 5,587,964 A | 12/1996 | Rosich et al. | 365/238.5 |
| 5,625,302 A | 4/1997 | Covino et al. | 326/93 |
| 5,835,970 A * | 11/1998 | Landry et al. | 711/218 |
| 5,903,174 A * | 5/1999 | Landry et al. | 327/162 |

OTHER PUBLICATIONS

Paradigm, "PDM44018 64K × 18 Fast CMOS Synchronous Static SRAM with Burst Counter", pp. 6–21 through 6–29.

Micron Semiconductor, Inc. "MT58LC64K18B2 64K × 18 Synchronous SRAM", Revised Apr. 9, 1993, pp. 1–12.

* cited by examiner

METHOD AND APPARATUS FOR REDUCING SKEW BETWEEN INPUT SIGNALS AND CLOCK SIGNALS WITHIN AN INTEGRATED CIRCUIT

This Application is a divisional of Ser. No. 08/960,584, Oct. 29, 1997, now U.S. Pat. No. 6,043,684, which is a continuation of Ser. No. 08/576,505, Dec. 21, 1995, now U.S. Pat. No. 5,835,970, which is a continuation of 08/575,554, filed Dec. 20, 1995 now U.S. Pat. No. 5,903,174.

BACKGROUND OF THE INVENTION

1. Field of the Invention

The invention generally relates to integrated circuits for use in computer systems and in particular to circuitry for use in inputting and decoding address signals within a synchronous integrated circuit having input buffers, decode units, sample and hold registers and the like.

2. Description of Related Art

State of the art integrated circuits for use in computer systems, such as cache-RAM integrated circuits and the like, require the fastest possible processing speeds and clock rates. Accordingly, it is desirable to gain speed improvements within all portions of the integrated circuit, particularly within input/output signal transmission paths. Within a cache-RAM integrated circuit, or similar synchronous integrated circuits, one component of the circuit which could benefit from speed improvement is the input path for address signals wherein input address signals are sampled and held in a clocked input register then decoded. FIG. 1 illustrates a conventional address input path circuit 10 wherein address signals received along an input line 12 are stored in a register 14 then decoded by pre-decode and mid-decode units 16 and 18, respectively. Additional decode units, not shown, may additionally be employed. Register 14 is clocked by a clock signal received along input clock line 20 by an input buffer 22. Prior to triggering register 14, the input clock signal is passed through a pulse generator 24 which generates a pulse of predetermined width on each rising edge of the input clock signal for use elsewhere within the integrated circuit containing address input path circuit 10. Additionally, the clock signal is passed through a control logic unit 26 which, depending upon the implementation, may control the clock signal based upon control signals received elsewhere in the circuit.

For proper operation of register 14, the clock signal must be received by the register during a time period during which the address signal received along line 12 is available to the register. In order to have margin for set-up time, the clock signal should be received by the register as late as possible. In order to have margin for hold time, the clock signal should be received by the register as early as possible. In order to respect both set-up and hold times, the clock signal is required to be received by the register within a given time window relative to the reception of the address signal at the input of the register. Preferably, the clock signal is received by the register at about a midway time during this time window, to provide substantially equal set-up and hold time margins for the address signal. However, passing the clock signal through pulse generator 24 and control logic 26 causes a certain amount of delay which may prevent the clock signal from reaching register 14 in a timely manner. Accordingly, a delay unit 28 is provided along the input path of the address signal prior to register 14 to delay the address signal by an amount sufficient to ensure that the address signal is available to the register during the time period in which the clock signal is received by the register.

Ideally, the set-up and hold time for register 14 is kept to a minimum thereby allowing the input address signal to be promptly passed on to the decode units for processing. In practice, however, it is often necessary to provide a fairly long set-up and hold time period to account for any timing differences or skew between availability of the address signals and receipt of the clock signal. If the set-up and hold time is too short, then any significant skew may cause the clock signal to be received either before or after the set-up and hold period, resulting in loss of the input address data.

One source of timing skew occurs as a result of process variations in the fabrication of input buffers 13 and 22. FIG. 2 illustrates an exemplary conventional input buffer cell 30 subject to process variations. Input buffers 13 and 22 of FIG. 1 may be composed of a number of input buffer cells with one cell per individual input line. Buffer cell 30 includes a first inverter stage 32 and a second inverter stage 34. Inverter stage 32 includes a PMOS device 36 and NMOS 38. Although not shown, inverter stage 34 may incorporate a similar device arrangement. Collectively, the pair of inverters of the input buffer cell operate to receive, and perhaps modify, an input signal. The input buffer cell may, for example, modify the voltage range of the input signal to range from between 0 to 3 volts to between 0 to 5 volts. Although the input buffer cell of FIG. 2 may adequately operate to achieve those results, the use of both PMOS and NMOS devices results in timing skews as a result of process variations between the PMOS and NMOS devices. As such, signals sent simultaneously through two different input buffer cells configured as in FIG. 2 will likely be output by the input buffers with a slight timing difference or skew. This skew is especially noticeable when one input is rising and another input is falling. Hence, if implemented using the buffer cells of FIG. 2, the input buffers of FIG. 1 will likely output their respective address or clock signals subject to a timing skew affecting the receipt of the signals by the register. To compensate for the possibility of such a timing skew, the overall set-up and hold time of the register must be set to a somewhat longer time period than would otherwise be desirable, resulting in overall poorer timing specifications for the entire integrated circuit containing the register.

FIG. 3 illustrates one possible solution for eliminating the process skew problems in the configuration of FIG. 2. More specifically, FIG. 3 illustrates an input buffer cell 40 having a pair of inverter stages 42 and 44 with individual device components of inverter stage 42 separately shown. (Inverter stage 44 may have a similar configuration to the first inverter stage of FIG. 2.) As can be seen, inverter stage 42 includes a pair of NMOS devices 46 and 48 with a gate of device 46 connected to a power supply and a gate of device 48 connected to the input. NMOS device 46 is smaller in size and strength than NMOS device 48. With this configuration, timing skew problems resulting from process variations between PMOS and NMOS devices are avoided because only NMOS devices are employed. Thus, by configuring the input buffers of FIG. 1 using the NMOS-only cell configuration of FIG. 3, timing skew as a result of process variations between the address signals and the clock signals is reduced thereby allowing a more precise set-up and hold time to be specified for the register. Unfortunately, although the NMOS configuration of FIG. 3 helps eliminate process skew problems, significant power consumption occurs as a result of leakage current within the input buffer cell. More specifically, by employing two NMOS devices in series between a power source and ground, a DC path is provided, thereby consuming significant power. Accordingly, relatively large current flows through the first inverter stage 42, particularly, when the input is held high. Additionally, some current passes through the second inverter stage 44 when the input is held low. The current drawn through the first inverter is caused by the two NMOS devices both being in an active state when the input is held high. The current flow through the second inverter 44 is caused by a voltage drop across NMOS pull-up device 46 when the input is held low. This voltage drop results in a voltage level at the input of the second inverter 44 which is not high enough to completely turn off the PMOS device (not separately shown) of the second inverter resulting in further leakage current.

Hence, the input buffer configuration of FIG. 3 reduces timing skew as a result of process variations but does so at the expense of consuming significantly greater current. FIG. 4 illustrates yet another configuration for an input buffer cell which also reduces process skew variations and provides improved power consumption, yet which is also not optimal. More specifically, FIG. 4 illustrates an input buffer cell 50 having a first inverter stage 52 and a second inverter stage 54. Again, the second inverter stage may be simple PMOS/NMOS inverter such as illustrated in FIG. 2. Inverter stage 52 includes a pair of NMOS devices 56 and 58 and a PMOS device 60. NMOS devices 56 and 58 are connected similarly to corresponding NMOS devices of the input buffer cell of FIG. 3 with NMOS device 56 being smaller than NMOS device 58. However, whereas the small NMOS device 46 of FIG. 3 is connected directly to a power supply, the drain of the NMOS device 56 is connected to the power supply through PMOS device 60. A gate of device 60 is connected to the input line. By providing PMOS device 60 connected as shown, power consumption is substantially eliminated when the input is held high. However, when the input is held low, some current leakage still occurs within the second inverter stage for the same reasons as described with reference to the input buffer cell of FIG. 3. Hence, the addition of the PMOS device within the first stage only partially eliminates the current leakage problem. It should be noted that the presence of the PMOS device in the first stage does not result in process skew because transmission of the input signal through the first inverter stage to the second inverter stage is controlled by the pair of NMOS devices.

Thus, it would be desirable to provide an improved method for eliminating process skew between input buffer cells, such as those employed within the address signal input path of FIG. 1, yet which does so with little or no resulting leakage current. The provision of such an improved input buffer cell would allow for a reduction in the required set-up and hold times for the input register without unduly increasing power consumption.

Referring again to FIG. 1, a second area in which timing improvement can be gained lies within the positioning of decode units 16 and 18. As shown in FIG. 1, the decode units are positioned after the register resulting in additional timing delays beyond those occurring during signal transmission prior to the register. One proposed solution is illustrated in FIG. 5. The address input path arrangement of FIG. 5 is similar to that of FIG. 1 and like components are identified by like reference numerals, incremented by 100. The arrangement of FIG. 5 is not necessarily prior art to the present invention. In the arrangement of FIG. 5, the decode units prior to the register are arranged to eliminate delay occurring following the register. Moreover, no significant additional delay occurs prior to the register. Rather, the timing delay artificially added by way of delay unit 128 is reduced to account for any additional delay caused by the presence of decode units 116 and 118. Hence, whereas delay unit 28 of FIG. 1 provides sufficient delay to account for clock signal delays through pulse generator 24 and control logic 26, delay unit 128 of FIG. 5 provides only sufficient delay to account for any remaining timing differences between address signals passed through decode units 116 and 118 and clock signals passed through pulse generator 124 and control logic 126.

Hence, timing delays occurring prior to the registering of the address signal are not substantially increased, yet timing delays occurring after the register are reduced significantly by not requiring decode operations to be performed subsequent to registering. Although the arrangement of FIG. 5 provides significant overall timing improvement, further improvement can be gained. In particular, the presence of the decode units prior to the register results in some additional skew which, if not compensated for, could require an increase in the set-up and hold times for the register thereby forfeiting some of the advantage gained by repositioning the decode units. More specifically, timing skew may occur through the decode units between two address signals composed of differing numbers of zeros and ones. The address input path must accommodate any possible address input signals ranging from those containing all zeros to those containing all ones. Hence, any timing differences between transmission of different address signals must be compensated for by providing a correspondingly longer set-up and hold period, resulting in the aforementioned degradation in the overall timing advantages of the address input path of FIG. 5.

The timing skew occurring as a result of differences in address input signals will now be described more fully with reference to FIG. 6. Decode units, such as pre-decode unit 114 and mid-decode unit 116 of FIG. 5, are typically configured with sets of NAND gates or NOR gates for performing logic operations to achieve decoding of a multiple bit binary input address signal. FIG. 6 illustrates a single conventional CMOS NAND gate receiving two input address bits along lines 132 and 134, respectively. NAND gate 130 includes a pair of PMOS devices 136 and 138 connected in parallel to a power source and a pair of NMOS devices 140 and 142 connected in a series between a ground and a node interconnecting drains of the pair of PMOS devices. Gates of PMOS devices 136 and 138 are connected, respectively, to input lines 132 and 134. An output line 144 is connected to the node interconnecting the two PMOS devices and NMOS device 140.

The amount of time required for NAND gate 130 to input signals and generate an output signal depends on whether the input signals are both zero, both one, or a combination of the two. More specifically, when an input signal along line 132 transitions from a high state to a low state while an input signal along line 134 is held high, the output line is pulled up through only one of the two PMOS devices, namely, PMOS device 136. On the other hand, if both inputs transition simultaneously from high to low, the output is pulled up by both PMOS devices. Two PMOS devices pulling up the output line, rather than only one, results in faster propagation of the signals through the NAND gate. Hence, timing skew occurs between two NAND gates receiving different input signals. Although not separately shown, similar skew problems occur between two NOR gates receiving different input signals.

For a practical implementation of a pair of pre-decode and mid-decode units, hundreds of NAND gates and NOR gates may be employed to collectively decode an input address signal composed of, for example, 32 or 64 bits. The collective difference in timing delays among the many levels of NAND gates and NOR gates can be significant requiring the set up and hold time for register to be increased to accommodate the resulting timing uncertainty in the availability of the address signal to thereby ensure that clock signal is received while the address signal is actually available.

Accordingly, it would be desirable to provide an improved logic gate, such as a NAND gate or NOR gate, for use in a decode unit to substantially eliminate timing skew between the output of signals corresponding to different input signals to thereby achieve overall improved timing performance.

SUMMARY OF THE INVENTION

In accordance with one aspect of the invention, an improved input path circuit for inputting signals into an integrated circuit chip, or the like, is provided. The input path circuit includes an input signal path, having an input buffer, for inputting signals to a clocked register. The input path circuit also includes a clock input path, having an input buffer, for inputting a clock signal to the register. Circuitry is provided, within input buffer cells of both the input buffer of the input signal path and the input buffer of the clock path, for reducing process-related timing skew between the input signals and the clock signal to thereby help ensure that the clock signal is received by the register while the input signals are available to the register subject to a fairly narrow set-up and hold time. Circuitry is also provided, within both input buffers, to significantly reduce current leakage through the input buffers despite the presence of the circuitry for reducing the process-related timing skew.

In an exemplary embodiment, the input buffer cells include first and second inverter stages connected between input and output paths. The first inverter stage includes a PMOS device and a pair of dual NMOS devices connected in series from a power supply to a ground. Gates of the PMOS device and one of the NMOS devices are connected to the input path. A gate of the other NMOS device is connected to the power supply. The NMOS device connected to the power supply is smaller in size than the NMOS device connected directly to the input. The second inverter stage includes an inverter, which may be otherwise conventional, having an input connected to a node connecting outputs of the two NMOS devices of the first inverter stage and having an output connected to the output path. The second inverter stage also includes a feedback path having a PMOS device. The PMOS device of the second inverter stage has a gate connected to the output of the inverter, a source connected to the power supply and a drain connected to the input to the inverter. The PMOS device of the feedback path is also small in comparison with the NMOS device of the first inverter stage that is connected directly to the input. Collectively, the two NMOS devices of the first inverter stage comprise the circuitry for reducing process-related timing skew and the pair of PMOS devices of both the first and second stages comprise the circuitry for reducing current leakage.

With this configuration, the PMOS device of the feedback path operates to pull-up the voltage on the input of the inverter to reduce current leakage through the inverter particularly when input to the first stage inverter is low. In that input state, the NMOS device of the first stage does not adequately pull the voltage input to the inverter sufficiently high to completely reduce leakage to the inverter of the second stage. The PMOS device of the feedback path, however, operates to pull the voltage to a level beyond that which would otherwise be achieved by the NMOS device alone, thereby reducing current leakage through the inverter of the second stage.

Thus, the input buffer cell of the invention helps reduce process skew while not increasing current leakage over conventional input buffers. The input buffer cell is advantageously employed within input buffers of an input path circuit of the type described above having an input address signal path and a clock signal path feeding into a clocked register. By reducing relative timing delays between the input address signals and the clock signal caused by process skew, the set-up and hold time of the register may be reduced thereby improving overall performance. The input buffer cell arrangement wherein a feedback PMOS device is provided in connection with a pair of inverter stages, the first of which has dual NMOS devices, may be advantageously employed in other devices as well.

DETAILED DESCRIPTION OF EXEMPLARY EMBODIMENTS OF THE INVENTION

With reference to the remaining Figures, exemplary embodiments of the invention will now be described. The exemplary embodiments are primarily described with reference to a computer system incorporating a cache-RAM chip. It should be appreciated that principles of the invention may be incorporated within other systems as well and the illustrated computer system having a cache-RAM is merely one possible embodiment incorporating the invention. Also, it should be appreciated that not all components necessary for a complete implementation of a practical system incorporating the invention are illustrated or described in detail herein. Rather, only those components necessary for a thorough understanding of the invention itself are illustrated and described. Furthermore, components which are either conventional or may be readily designed and fabricated in accordance with the teachings provided herein are not described in detail.

Figure 7:
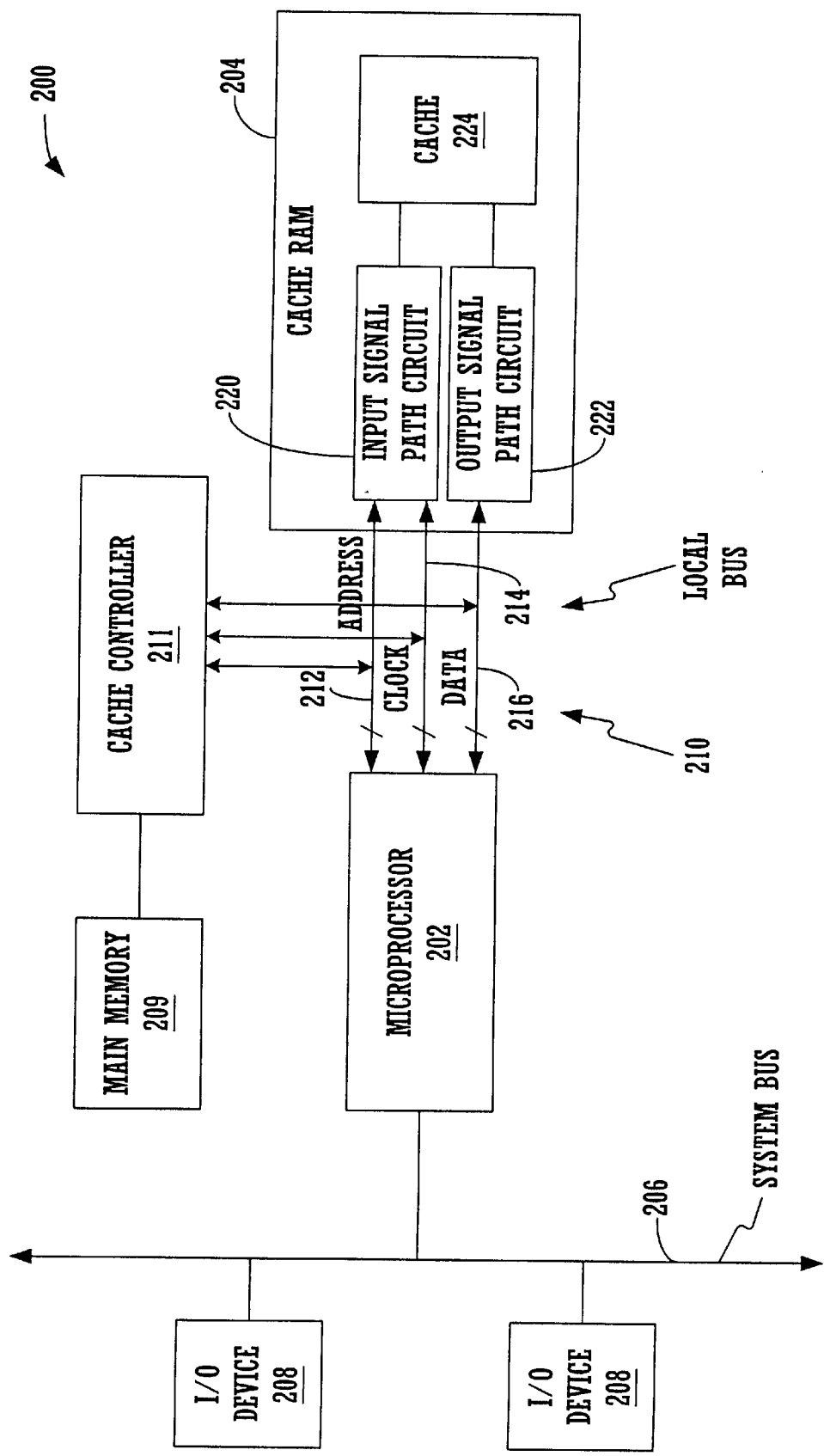
FIG. 7 is a block diagram of a computer system incorporating a cache RAM having an input path circuit configured in accordance with the invention.

FIG. 7 illustrates an exemplary computer system 200 having a microprocessor 202 and a separate cache RAM unit 204. Microprocessor 202 is connected, through a system bus 206, to one or more input or output devices 208 such as keyboards, disk drives, video display screens and the like. Microprocessor 202 is connected to cache RAM 204 and cache controller 211 by a local bus which includes lines for transmitting data, address and clock signals from the microprocessor to the cache RAM and cache controller and data signals from the cache RAM and cache controller to the microprocessor. The cache controller 211 additionally connects to main memory 209. Within FIG. 7, local bus 210 is shown to include an address line 212, a clock line 214 and a data line 216. Address line 212 may itself be a bus capable of transmitting all bits of a multi-bit address, such as a 32-bit address or a 64-bit address, in parallel. Likewise, data line 216 may be a bus capable of transmitting all bits of a multi-bit data words, such as a 16-bit or 32-bit word. Additional lines, such as control signal lines, are not separately shown.

Cache-RAM unit 204 includes an input path circuit 220 connected to address and clock lines 212 and 214 and an output path circuit 222 connected to data line 216. An additional input path circuit for inputting data signals is not separately shown. The cache RAM unit also includes a cache circuit 224 for accessing cached data, based upon an address provided along line 212, and for outputting data found at the address to the output path circuit for subsequent transmission over data line 216 to the microprocessor. The input signal path circuit includes improved circuitry for inputting address signals into the cache RAM unit to achieve improved timing performance, despite process variations or input signal variations, and without consuming undue additional current.

Figure 8:
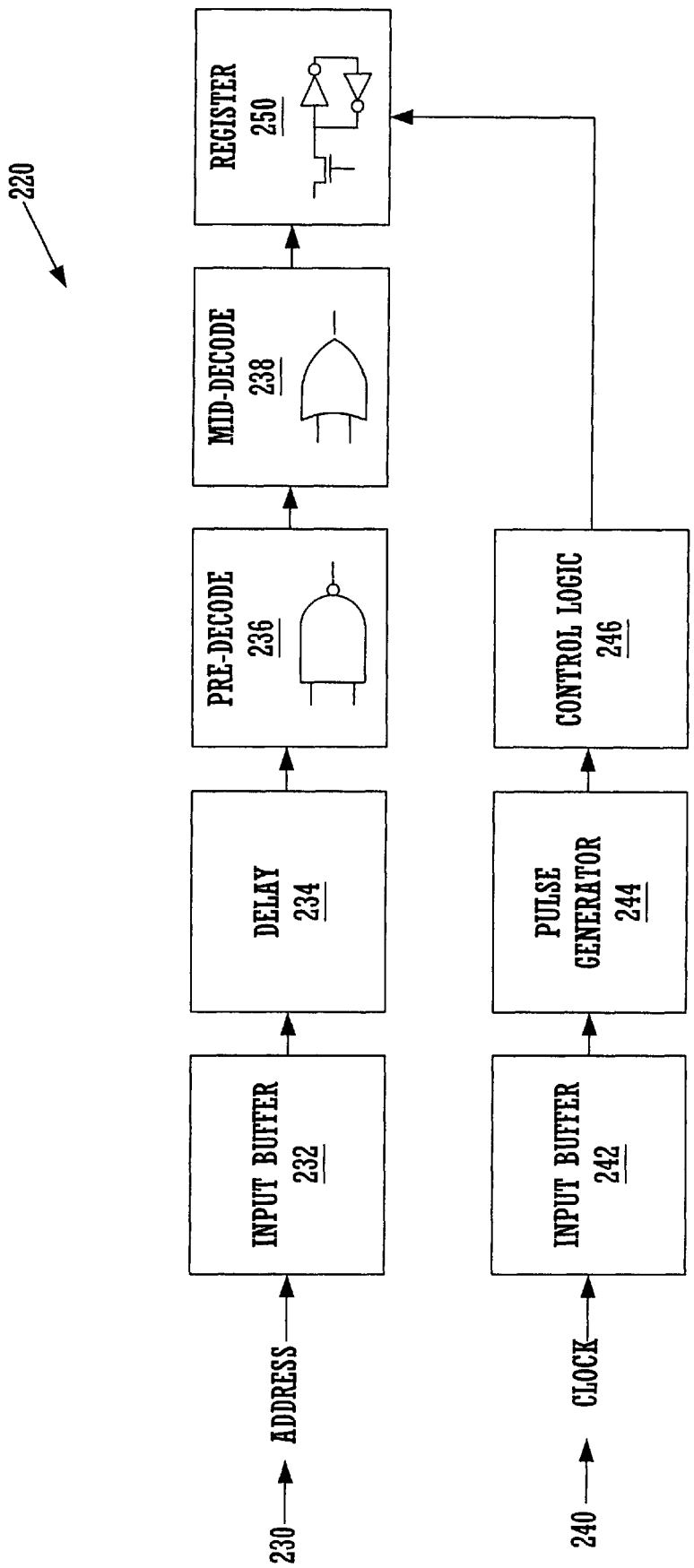
FIG. 8 is a block diagram of the input path circuit of FIG. 7.

FIG. 8 illustrates address input signal path circuit 220 of FIG. 7. Input signal path circuit 220 includes an address path 230 having an input buffer 232, a delay unit 234, a pre-decode unit 236 and a mid-decode unit 238. The input signal path circuit also includes a clock path 240 having an input buffer 242, a pulse generator 244 and a control logic unit 246. A clocked register 250 receives decoded address signals from mid-decode unit 238 and a clock signal from control logic unit 246. Signal propagation delays along the address path and the clock path are controlled to ensure that the register receives the clock signal during a set-up and hold period during which the address signal is available. In particular, delay unit 234 of the address path is provided to add additional delay to the address signals to compensate for any excess in delay of the clock signal through the clock path over delays of the address signal through the address path. By positioning the decode units prior to the register, rather than subsequent to the register as illustrated in the conventional input path circuit of FIG. 1, additional decode timing delays are avoided. Rather, any additional delay along the address path prior to the register caused by the presence of the decode units is compensated for by reducing the amount of delay which otherwise would be provided through the delay unit.

As described above, problems can arise within an input path circuit as a result of differences in timing delays between address and clock signals received through the different input buffers or among different address signals passed through the decode units. Timing delay differences between the address and clock signals passed through the input buffers may occur as a result of process variations between the input buffers. Differences in timing delays among address signals may occur as a result of different logic delays through the decode units. Either type of timing delay can result in problem wherein the register may not receive the clock signal while the address signals are available necessitating a longer set up and hold time period for the register to compensate for any such differences. However, both the input buffers and the decode units of the input signal path circuit of FIG. 8 include circuitry provided to reduce timing delay differences to thereby allow set up and hold time for the register to be reduced thereby improving overall timing performance. In the case of the input buffers, the circuitry provided to reduce timing delay differences is configured to also minimize any additional power requirements as a result of leakage current. The improved circuitry within the input buffers will first be described with reference to FIG. 9, then improved circuitry for use within the decode units will be described with reference to the remaining Figures.

Figure 9:
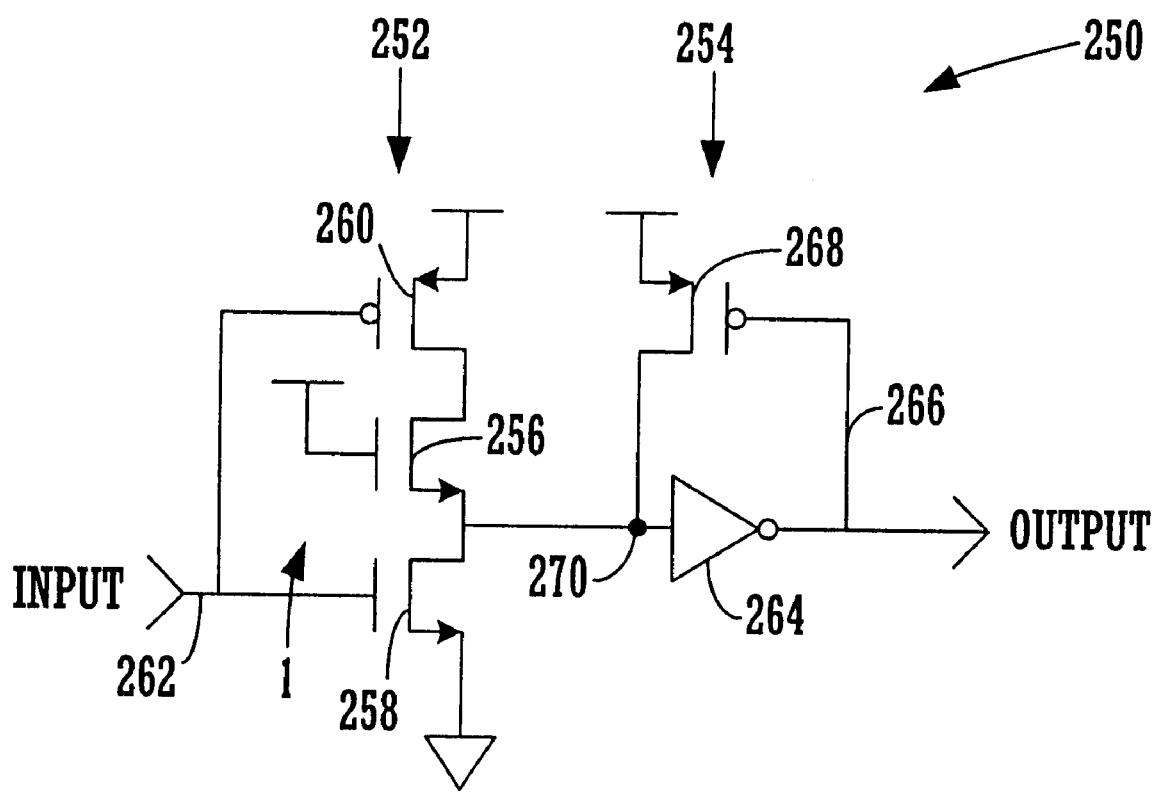
FIG. 9 is a circuit schematic of an input buffer cell for use within the input buffers of the input path circuit of FIG. 7.

FIG. 9 illustrates an input buffer cell 250 for use within input buffer 232 or 242 of the input path circuit of FIG. 8. For input buffer 232, which may receive an entire set of address bits in parallel, such as 32 bits or 64 bits, an entire set of input buffer cells of the type illustrated in FIG. 10 may be required. For input buffer 242, which receives only a single clock signal, only a single input buffer cell 250 may be required.

Input buffer cell 250 includes a first inverter stage 252 and a second inverter stage 254. The first inverter stage includes a pair of matched NMOS devices 256 and 258 connected in series along with a PMOS device 260 between a ground and a power supply. An input line 262 is connected both to a gate of PMOS device 260 and a gate of NMOS device 258. A gate of NMOS device 256 is connected directly to the power supply. NMOS device 256 is smaller in size, and therefore also smaller in strength, than NMOS device 258.

Second inverter stage 254 includes an inverter 264, which may be otherwise conventional, and a feedback path 266 containing an additional PMOS device 268. A gate of PMOS device 268 is connected to an output of inverter 264. A source and drain of PMOS device 268 are connected, respectively, to the power supply and to an input of the inverter. The input of the inverter is also connected to a node interconnecting the pair of NMOS devices of the first inverter stage.

With this configuration, timing delay variations caused by process variations are substantially eliminated by employing the dual matched NMOS devices in the first stage. Current leakage through the first stage is substantially reduced by employing PMOS device 260 between the power source and the dual NMOS devices. Additional current leakage, which might otherwise occur through inverter 264, is substantially reduced by the second PMOS device 268 along feedback path 266. Both NMOS device 256 and PMOS feedback device 268 are small in comparison with NMOS device 258.

With this configuration, the input buffer cell operates as follows. When the input signal along line 262 transitions from a low logic level to a high logic level, node 270 is pulled down from high to low by NMOS device 258 and the voltage along the output line is pulled up, by inverter 264, from low to high. The input signal transition from low to high also causes PMOS device 260 to shut off thereby disabling current flow through the dual NMOS devices and preventing any significant leakage current while the input is held high. Likewise, the output line transition from low to high causes PMOS device 268 to shut off thereby eliminating any significant leakage current along the path through PMOS device 268 and NMOS device 258 while allowing NMOS device 258 to fully pull node 270 to a stable low voltage value.

When the input signal along line 262 transitions from high to low, node 270 is pulled from low to high, and the output from inverter 264 ultimately transitions from high to low. PMOS device 260 is turned on, but NMOS device 258 is in an inactive state and therefore no significant current leakage occurs through the NMOS device. Moreover, when the output transitions from high to low, PMOS device 268 is activated to help pull up node 270 to a full high logic voltage value thereby fully turning off inverter 264 and preventing any significant leakage current from occurring within inverter 264.

Figure 1:
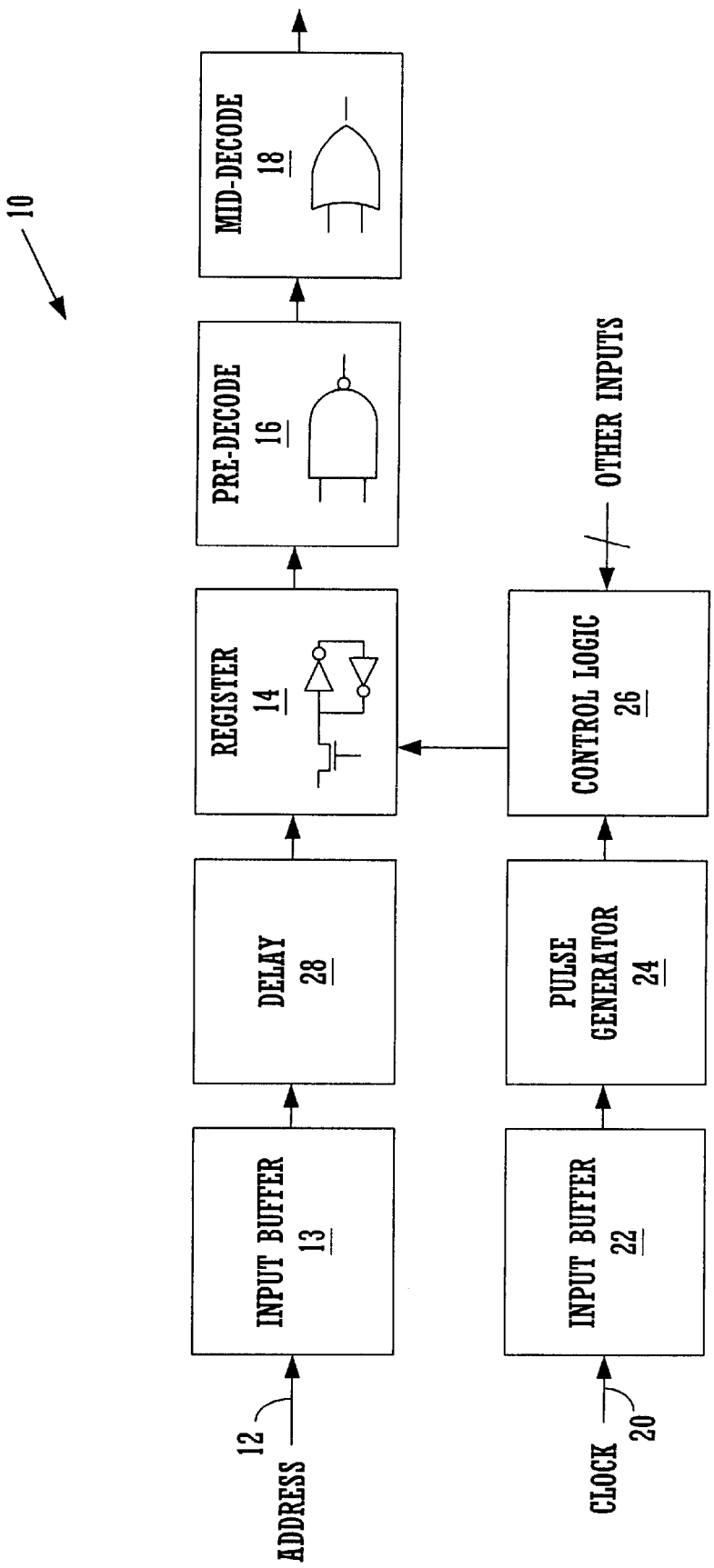
FIG. 1 is a block diagram illustrating a conventional input path circuit having input buffers provided along an address path and a clock path prior to a register and having a pair of decode units subsequent to the register.
Figure 2:
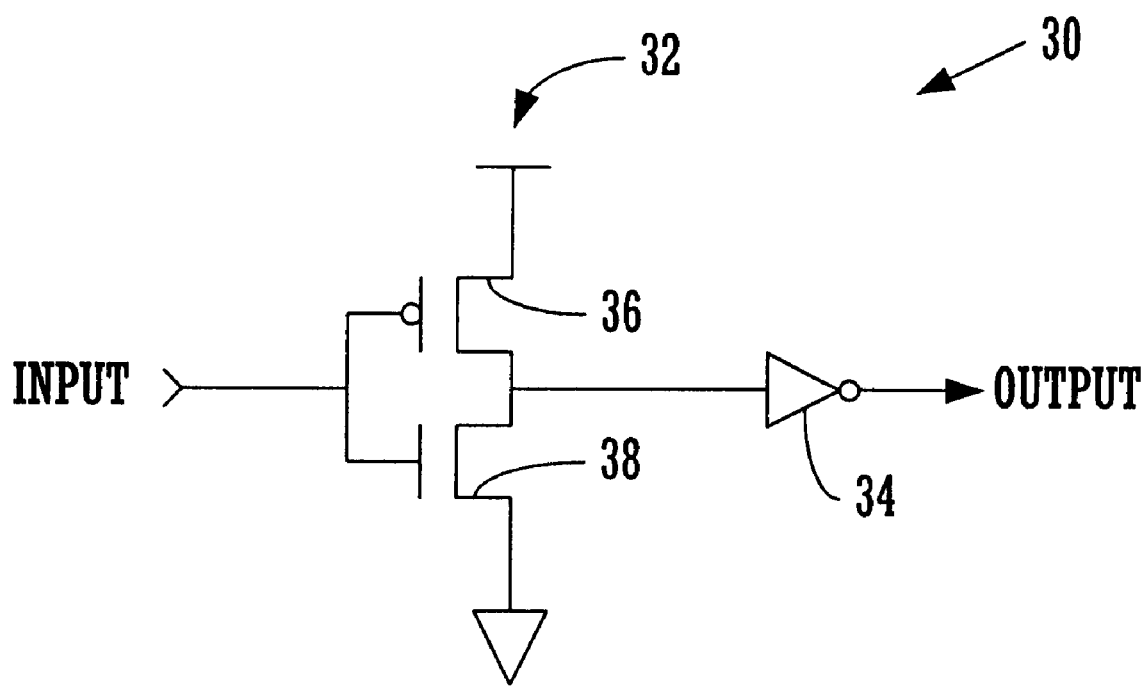
FIG. 2 is circuit schematic of a conventional input buffer cell for use within input buffers of the input path circuit of FIG. 1, wherein the input buffer cell is subject to timing delays dependent upon process variations.
Figure 3:
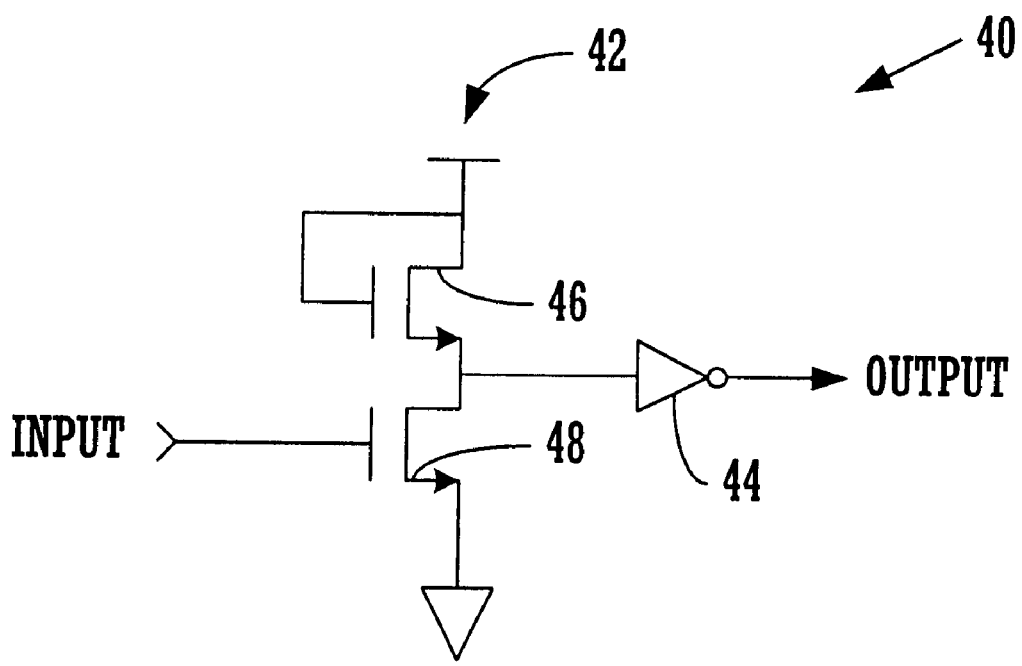
FIG. 3 is an alternative conventional input buffer cell modified to substantially eliminate timing variations caused by process skew but having significant leakage current.
Figure 4:
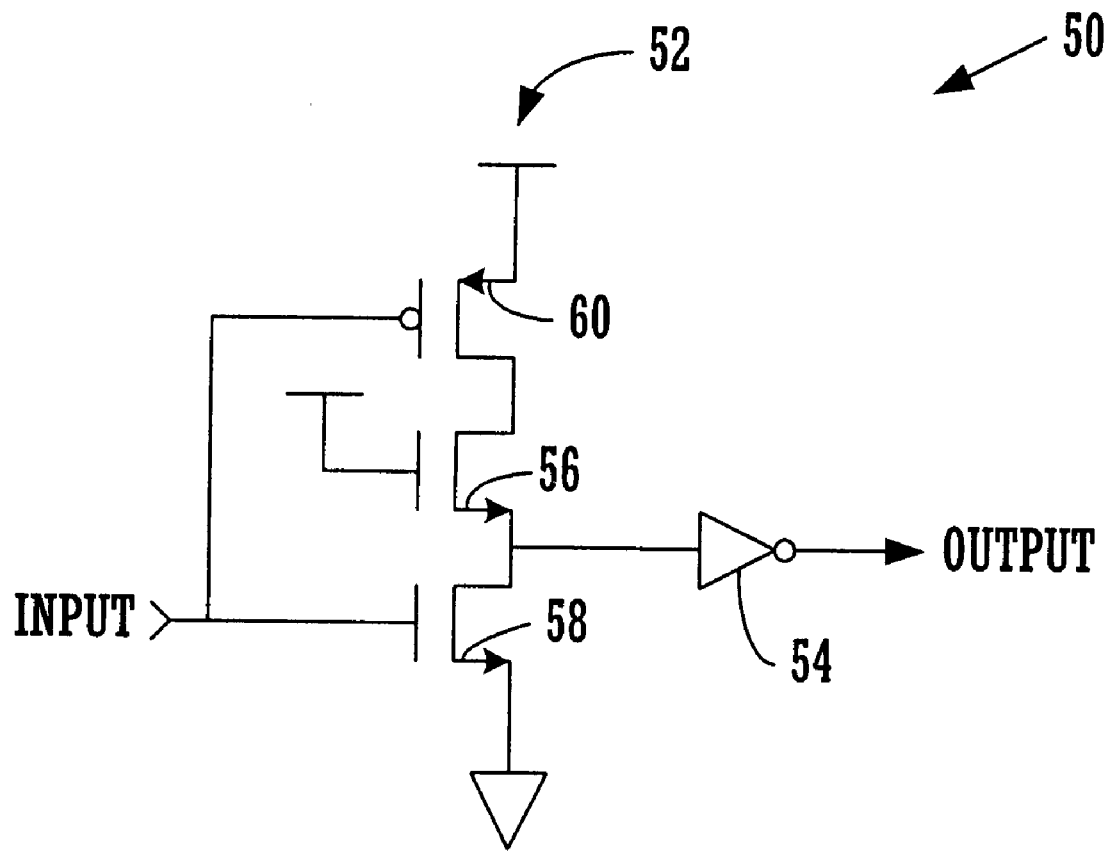
FIG. 4 is another alternative conventional input buffer cell further modified to reduce current leakage through a first inverter stage but retaining current leakage through a second inverter stage.
Figure 5:
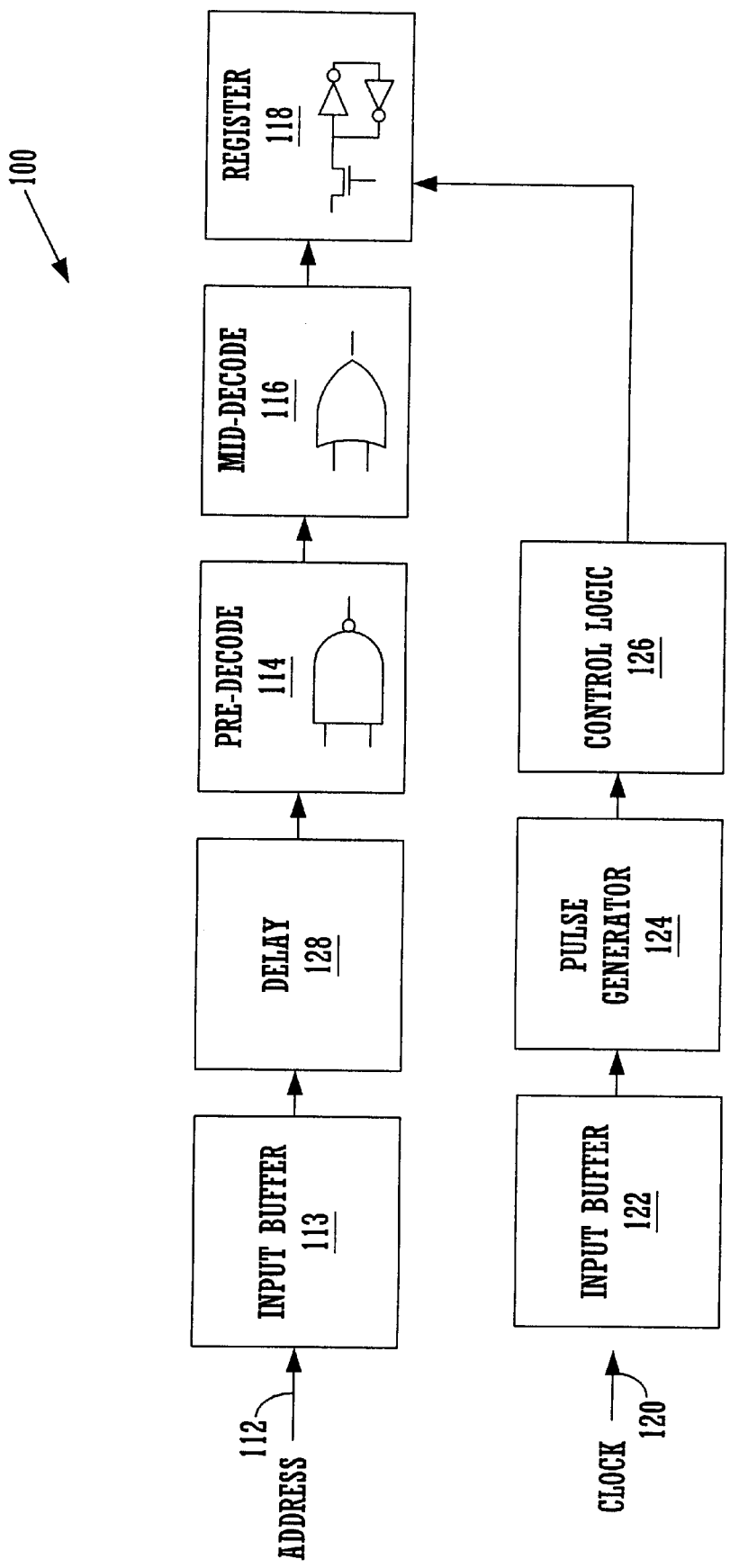
FIG. 5 is a block diagram of a proposed alternative to the input path circuit of FIG. 1 wherein decode units are provided prior to the sample and hold register.
Figure 6:
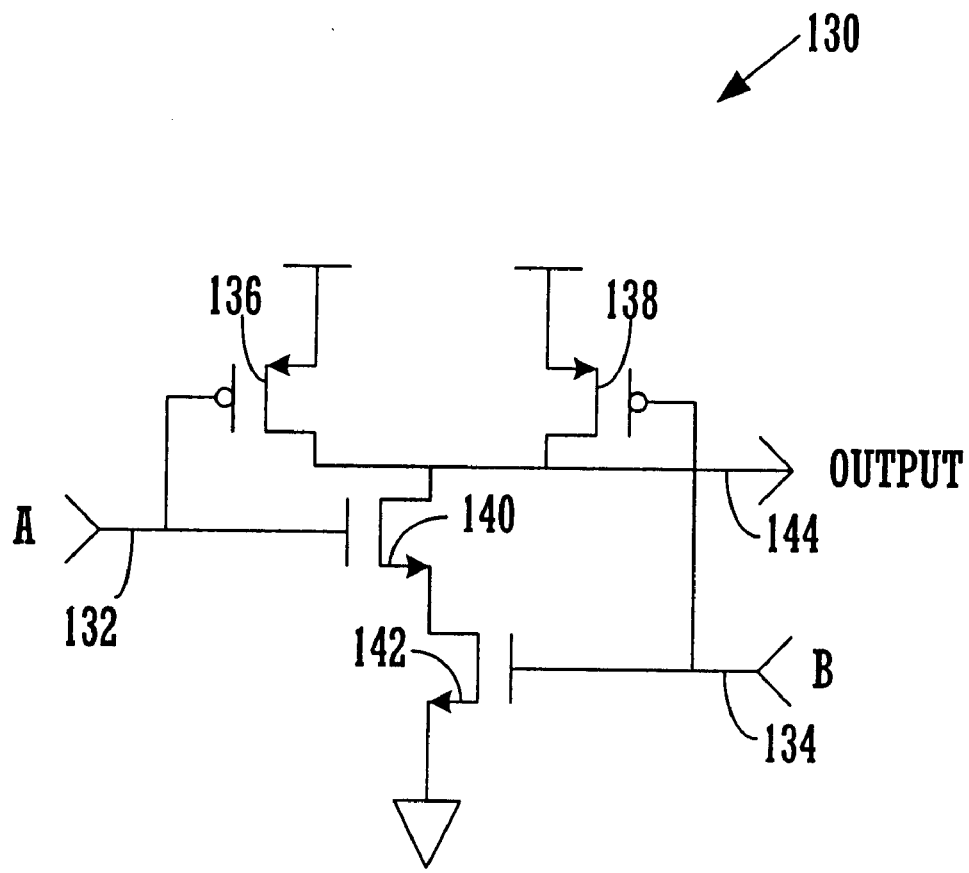
FIG. 6 is a circuit schematic of a conventional NAND gate for use within decode units of the proposed input signal path circuit of FIG. 5 wherein a timing delay through the NAND gate varies depending upon input signals to the NAND gate.

Thus, the input buffer cell arrangement of FIG. 9 operates to substantially eliminate propagation delay variation caused by process skew while minimizing current leakage. Of course, the actual propagation delay through the input buffer may be somewhat larger than propagation delays occurring through a simple conventional input buffer such as shown in FIG. 1, but for many implementations, such as the address input buffers of FIG. 8, an additional absolute delay is not a problem. Such an absolute delay may be offset or eliminated by reducing delay through other units, such as delay unit 234. The more significant problem, as noted above, is timing delay differences between input signals along different paths which would otherwise necessitate an increase in the set-up and hold time required for the input register thereby reducing overall timing performance.

As noted, devices 256 and 268 of FIG. 9 should be smaller in size and strength than NMOS device 258. Actual relative sizes of the devices may depend on a number of factors and hence no attempt is made herein to specify all possible sizes or ratios of sizes of the different components. In a typical embodiment, the smaller NMOS and PMOS devices (256 and 268) will likely need to be 1/10th the size of the larger NMOS device (258).

Table I illustrates specific sizes for one exemplary embodiment which was found to be suitable for some applications.

TABLE I

| Circuit Device | Device Size |
| --- | --- |
| NMOS Device 256 | 3.5/0.9 μm |
| NMOS Device 258 | 44.0/0.9 μm |
| PMOS Device 260 | 2.0/1.0 μm |
| PMOS Device 268 | 2.0/1.0 μm |
| Inverter 264 | 5/0.5 P   20/0.5 N |

Appendix A includes a circuit schematic for another exemplary embodiment of the input buffer circuit.

What has been described thus far is an improved input buffer circuit arrangement for use in reducing relative timing delays as a result of process variations while also minimizing current leakage. With reference to the remaining figures, an improved circuit arrangement for use within NAND gates and NOR gates of the decode units of the input path circuit of FIG. 8 will now be described. The improved NAND gates and NOR gates achieve reduced timing delays between different input signals such as between an input address signal composed of all zeros and an input address signal composed of all ones.

Figure 10:
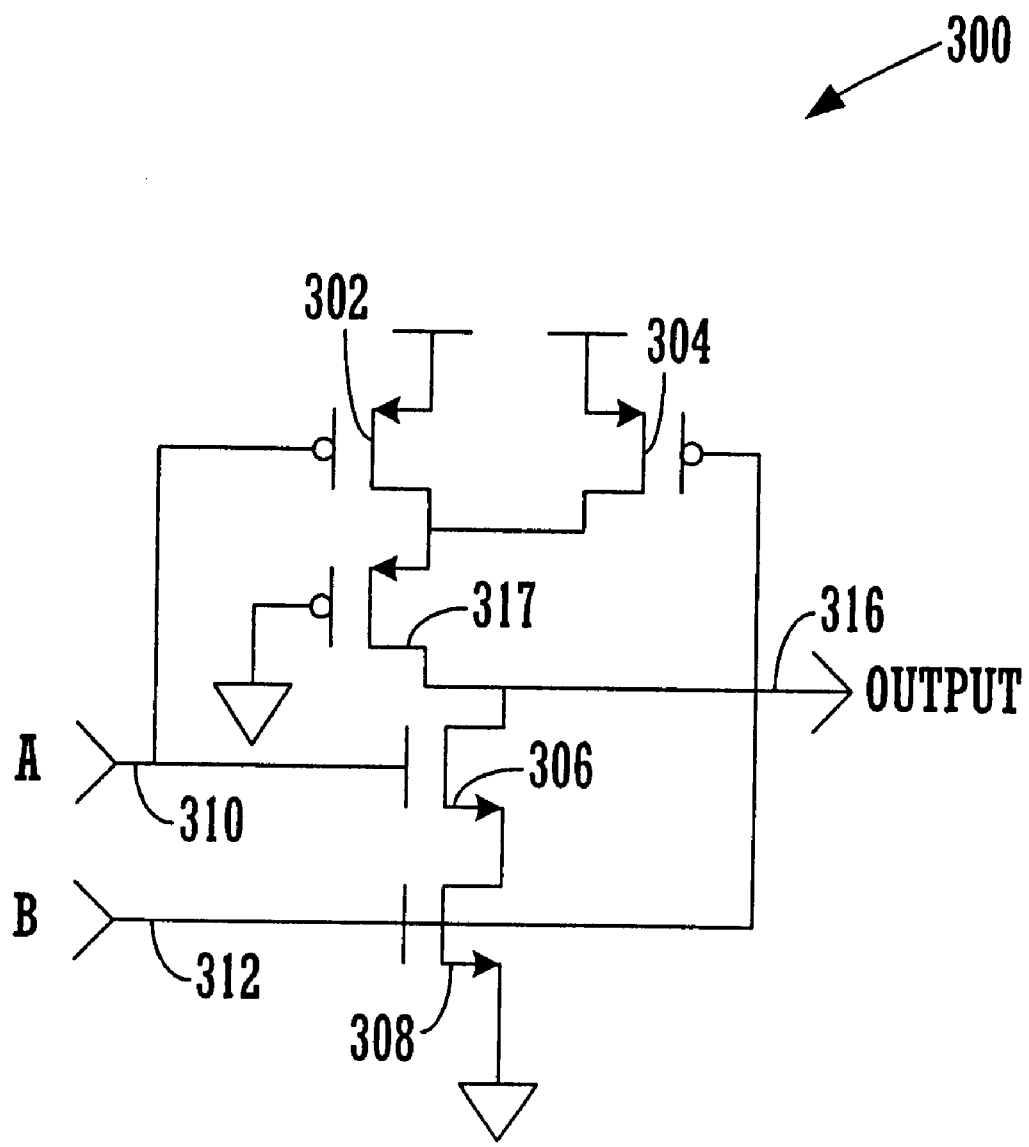
FIG. 10 is a circuit schematic for an exemplary embodiment of a NAND gate for use within one of the decode units of the input path circuit of FIG. 7.
Figure 11A:
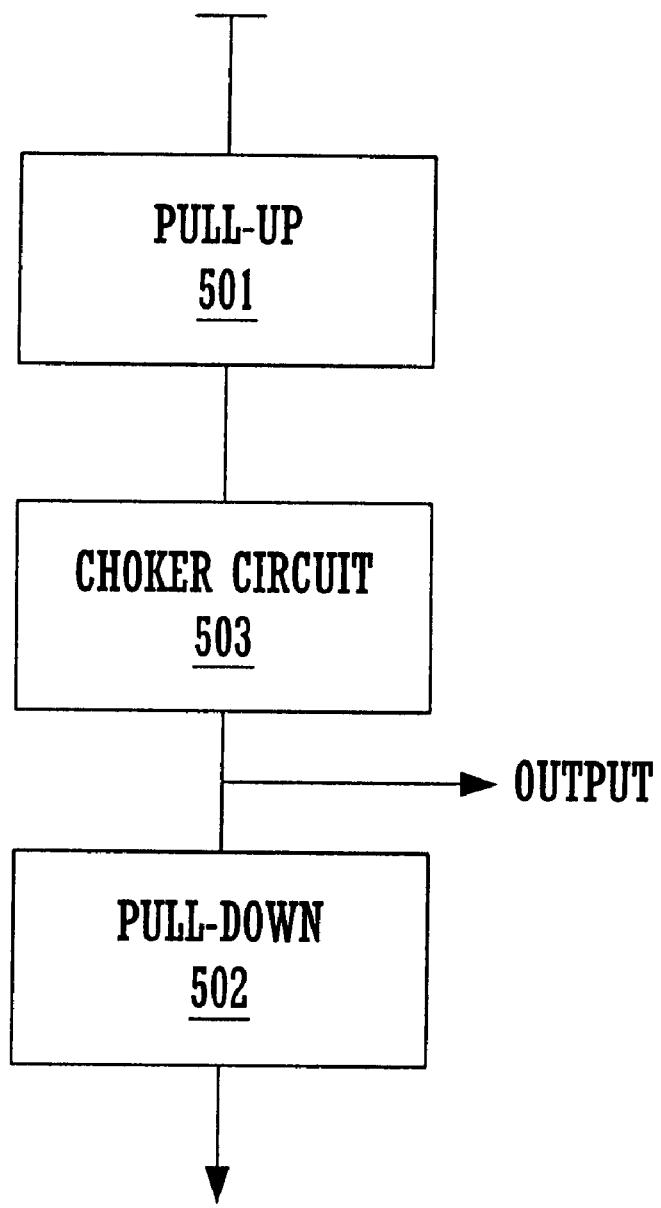
FIGS. 11a–11c are block diagrams illustrating, at a high level, three exemplary embodiments of a logic gate, such as the NAND of FIG. 9 for use within one of the decode units of the input path circuit of FIG. 7.
Figure 11B:
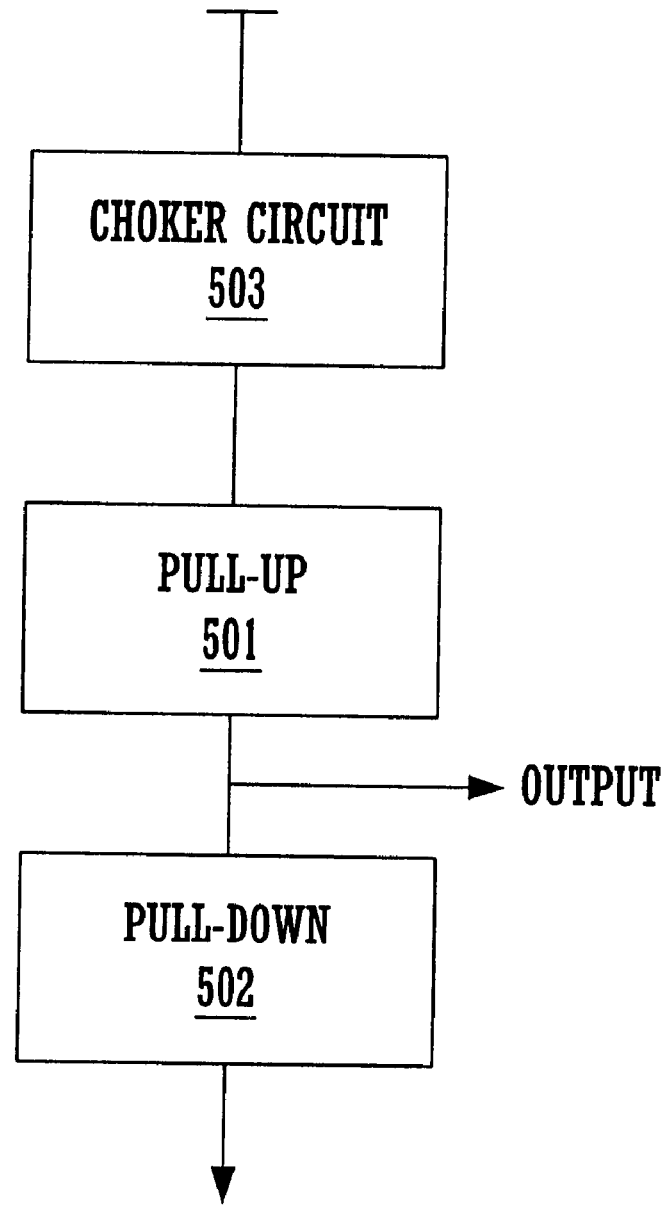
Figure 11C:
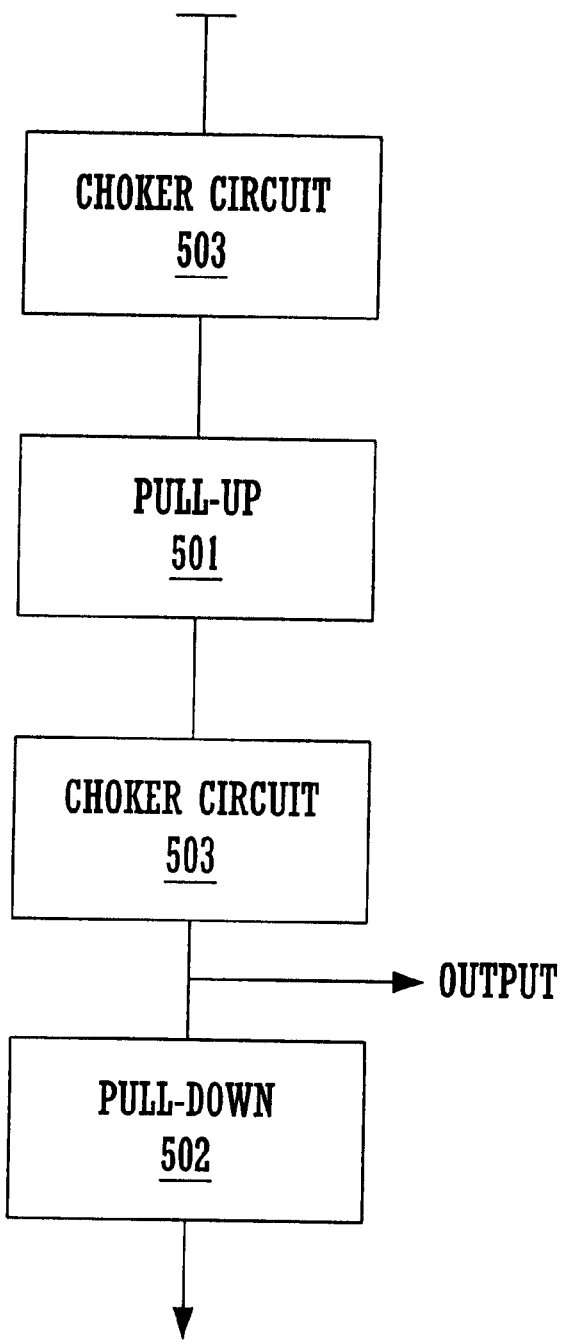
Figure 12:
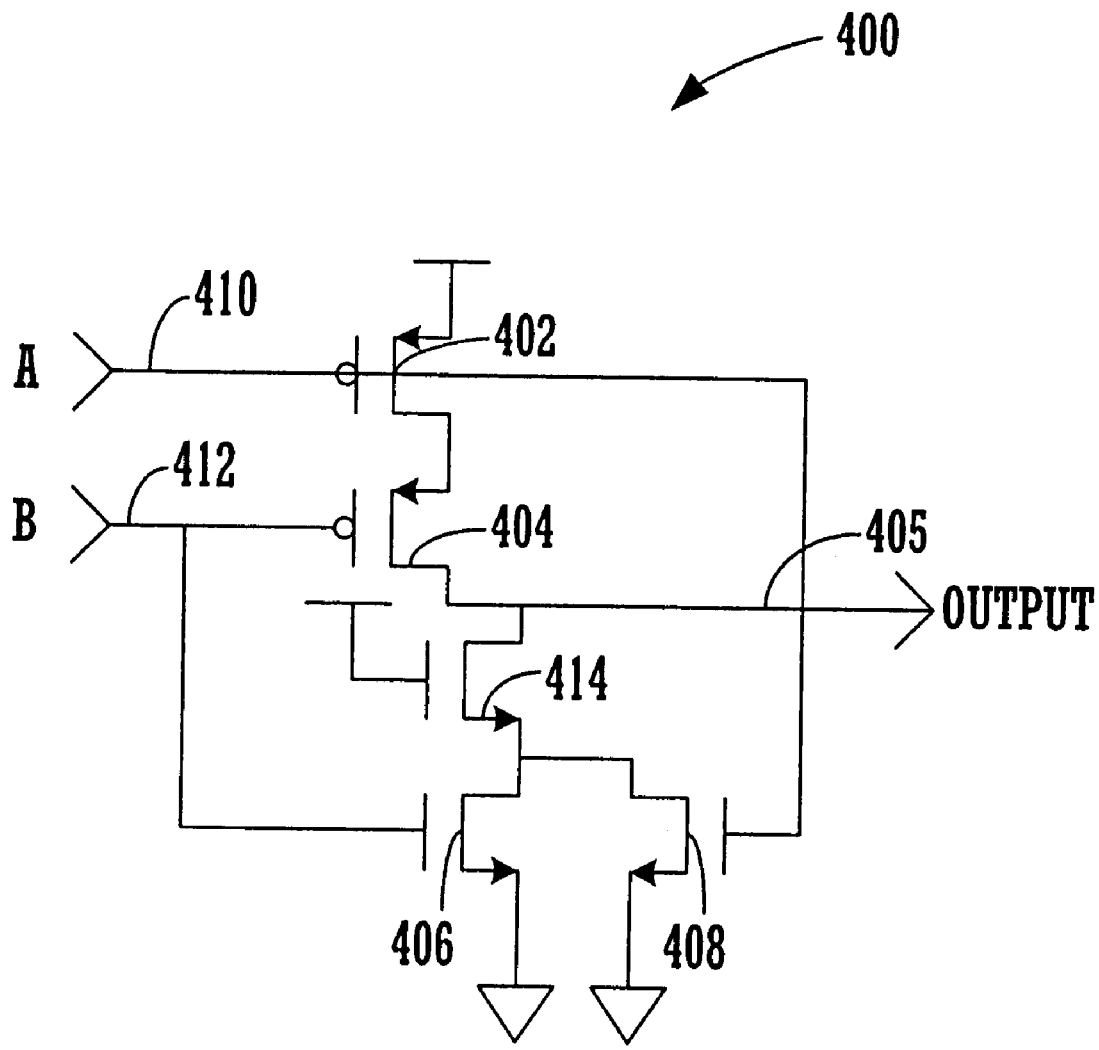
FIG. 12 is a circuit schematic for an exemplary embodiment of a NOR gate for use within one of the decode units of the input path circuit of FIG. 8.

FIG. 10 illustrates a specific improved NAND gate for use within the decode units of FIG. 8. FIGS. 11a–11c illustrate, at a high level, three basic configurations for improved logic gates, such as NAND gates, for use within the decode unit of FIG. 8. FIG. 12 illustrates a NOR gate for use within the decode unit of FIG. 8. The actual decode units may be composed of a large number of NAND gates, NOR gates and other logic gates, arranged to achieve a desired decode operation on an input multi-bit address signal. The manner by which the decode units may be configured by connecting various NAND gates and NOR gates and other logic devices may be conventional, is not pertinent to the invention, and will not be described further.

Referring first to FIG. 10, a NAND gate 300 is illustrated. The NAND gate includes a pair of PMOS devices 302 and 304 connected in parallel to a power supply and a pair of NMOS devices 306 and 308 connected in series to a ground. Gates of PMOS device 302 and NMOS device 306 are both connected to a first input line 310. Likewise, gates of PMOS device 304 and NMOS device 308 are both connected to a second input line 312.

NAND gate 300 also includes an additional third PMOS device 314 connected between the pair of parallel PMOS devices and the pair of series NMOS device. More specifically, a source of PMOS device 314 is connected to a node interconnecting drains of PMOS devices 302 and 304. A drain of PMOS device 314 is connected to the drain of NMOS device 306 and to an output line 316. Finally, a gate of PMOS device 314 is connected to a ground.

With this configuration, the additional PMOS device acts to choke the flow of current from the power supply to the ground to reduce the speed at which output signals are asserted onto output line 316. In other words, the effect of PMOS device 314 is to delay the assertion of the output signal by differing amounts depending upon the values of the input signals to thereby reduce any difference in delay between output signals corresponding to different input conditions.

Without the additional PMOS device 314, the output voltage may be pulled up either by only one of the two parallel PMOS devices or both of the parallel PMOS devices depending upon whether only one of the input values transitions to low or both transition to low. Accordingly, a transition of the input signals from 11 to 00 will propagate through an unmodified NAND gate faster than a transition of input signals from 11 to 10 or from 11 to 01. With the addition of PMOS device 314, however, the current flow from the pair of PMOS devices to the output line is reduced or choked resulting in a reduction in the difference in propagation delays between the two aforementioned states. This occurs because the charging of the output line is primarily regulated by the additional PMOS device 314 which is smaller than the sum of the dual parallel PMOS devices. Actual optimal sizes or ratio of size of the devices will vary depending upon the implementation. However, it is anticipated that the small PMOS device will typically be about one half or equal to the size of one of the parallel PMOS devices. Likewise, the actual reduction in timing delay differences among output signals generated from different input conditions will vary. Typically, however, if an output signal asserted on a transition from 11 to 00 is twice as fast as an output signal asserted from a transition of 11 to 10 or 01, the presence of the additional PMOS device may increase the 11 to 00 propagation time by 50% and increase the 11 to 10 or 01 propagation time by only 10%. As such, the delay difference between the two cases is substantially reduced and almost eliminated.

Table II provides exemplary device sizes for one implementation that has been found to be suitable for some applications.

TABLE II

| Circuit Device | Device Size |
| --- | --- |
| PMOS Device 302 | 18/0.5 µm |
| PMOS Device 304 | 18/0.5 µm |
| NMOS Device 306 | 10/0.5 µm |
| NMOS Device 308 | 10/0.5 µm |
| PMOS Device 314 | 18/0.5 µm |

In the circuit arrangement of FIG. 10, the additional PMOS device is positioned between the pair of dual PMOS devices and the output. In other embodiments, the additional PMOS device may be connected between the power supply and the dual PMOS devices. In still other embodiments, a pair of small PMOS devices may bracket the dual PMOS devices. In other embodiments, different circuit arrangements may be employed, consistent with the principles of the invention, to achieve a reduction in time delay difference. In general, any suitable means for choking the current supply to the output line may be suitable for reducing the time delay difference. In this regard, FIGS. 11a, 11b and 11c illustrate, in block diagram form, three basic embodiments with each having a pull-up unit 501, a pull-down unit 502, and one or more choker units 503 connected in series between a power supply and an output.

FIG. 12 illustrates a NOR gate provided with an additional NMOS device for choking current flow from an output line to a ground. More specifically, FIG. 12 illustrates a NOR gate 400 having a pair of PMOS devices 402 and 404 connected in series between a power supply and an output line 405. A pair of NMOS devices 406 and 408 are connected in parallel to a ground. Gates of PMOS device 402 and NMOS device 408 are connected to a first input line 410. Gates of PMOS device 404 and NMOS device 406 are connected to a second input line 412. An additional NMOS device 414 is connected between a node interconnecting drains of the dual NMOS devices with output line 405. The additional NMOS device operates to reduce current flow from the output line to thereby lower the discharge rate of the output line to reduce timing delay differences between the signals asserted onto the output line.

NMOS device 414 is smaller than the sum of the dual parallel NMOS devices and may be, for example, about equal to the size of one of the dual parallel NMOS devices. Other size ratios may be appropriate with size ratios from one half to equal being particularly useful. Table III illustrates device sizes from one specific embodiment.

TABLE III

| Circuit Device | Device Size |
| --- | --- |
| PMOS Device 402 | 12/0.5 µm |
| PMOS Device 404 | 12/0.5 µm |

TABLE III-continued

| Circuit Device | Device Size |
| --- | --- |
| NMOS Device 406 | 10/0.5 µm |
| NMOS Device 408 | 10/0.5 µm |
| NMOS Device 414 | 8/0.5 µm |

Appendix B includes a pair of circuit schematics corresponding to other specific NAND gate and NOR gate embodiments.

The NAND and NOR gates described herein are two-input logic gates. Principles of the invention, however, may also be applied to multiple input NAND gates, NOR gates and other logic gates. For example, for a multiple input NAND gate, a single small choke transistor device may be placed between an entire set of parallel PMOS devices and an output path. In other arrangements, two or more of choke transistor devices may be employed in connection with the set of parallel PMOS devices. For example, the set of parallel PMOS devices may be subdivided into subsets with each subset of parallel PMOS devices having a separate corresponding PMOS choke device. As can be appreciated, a wide range of embodiments may be configured in accordance with the invention for multiple input (or multiple output) logic gates, such as NAND gates and NOR gates.

What has been described are exemplary embodiments of circuit cell components of an improved input path circuit for use within integrated circuits, particularly those employed within computer systems, such as cache RAM devices and the like. The circuit cells described herein include means for or circuitry for reducing timing delay differences to the circuits occurring, for example, as a result of process variations or input signal variations. The particular circuit improvements described may, however, be employed in connection with other devices and need not be employed within the input path circuit of the invention. Likewise, other circuit improvements, other than those contained within the specific exemplary embodiments illustrated herein, may alternatively be employed in a manner consistent with the scope of the invention. In general, the exemplary embodiments described herein are intended merely to be illustrative of the invention and should not be construed as limiting the scope of the invention.

What is claimed is:

1. An input path circuit for use in an integrated circuit, said input path circuit comprising:

a first input path having a first input buffer for inputting a first signal selected from a group consisting of an address signal or a control path signal;

a second input path for inputting a clock signal;

a circuit connected to the first and second input paths for receiving signals therefrom, said circuit including a register and a decode unit coupled to said register, the output of said decode unit coupled to said register, said register operable upon receiving the clock signal to generate an output; and circuitry, within the first input buffer, for reducing skew between the input path delays, the circuitry having reduced current leakage and the circuitry not substantially affecting the relative delay of signals provided along the first and second input paths said circuitry including a first inverting stage having a pair of NMOS devices in series, a second inverting stage including an inverter, and a feedback path from an output of the inverter to an input of the inverter, with the feedback path including a PMOS device having a source connected to a power supply, a drain connected to the input of the inverter, and a gate connected to an output of the inverter.

2. The input path circuit of claim 1 wherein the second input path includes a second input buffer, the second input buffer including circuitry, having reduced current leakage, for reducing skew between the input path delays, said circuitry not substantially affecting the delay of said clock signal relative to the delay of said first signal.

3. The input path of claim 1 wherein the first inverting stage further includes a PMOS device connected in series between the pair of NMOS devices and the power supply, with a gate of the PMOS device of the first inverting stage connected to an input of the first inverting stage.

4. An input path circuit comprising:

(a) a first input path comprising a first input buffer having first and second PMOS devices, first and second NMOS devices, and an inverter; with said first PMOS device and said first and second NMOS devices connected in series between a power source and a ground; gates of said first PMOS device and said second NMOS device connected to a first input line; a gate of said first NMOS device connected to said power source; a gate of said second PMOS device connected to the output of the inverter; an input of said inverter connected to a drain of said second PMOS device and to a node interconnecting a source of said first NMOS device and a drain of said second NMOS device; and a source of said second PMOS device connected to said power supply, said first input path configured to input a first signal received at said first input line;

(b) a second input path comprising a second input buffer, said second input path configured to input a second, independent signal; and (c) a circuit connected to said first and second input paths configured to receive said first and second signals, said circuit including a register and a decode unit coupled to said register, the output of said decode unit coupled to said register, said register operable upon receiving said second signal to generate an output.

5. The input path circuit of claim 4, wherein said first signal is selected from the group consisting of an address signal, a data signal and a control signal.

6. The input path circuit of claim 4, wherein said second signal is a clock signal.

7. The input path circuit of claim 4, wherein said second input buffer comprises first and second PMOS devices, first and second NMOS devices and an inverter; with said first PMOS device and said first and second NMOS devices connected, in series, between said power source and a ground; gates of said first PMOS device and said second NMOS device a second input line, a gate of said first NMOS device connected to said power source, and a gate of second PMOS device connected to the output of the inverter; an input of said inverter connected to a drain of said second PMOS device and to a node interconnecting a source of said first NMOS device and a drain of said second NMOS device; and a source of said second PMOS device connected to said power supply.

* * * * *